United States Patent [19]

Iwamoto et al.

[11] Patent Number: 5,448,333
[45] Date of Patent: Sep. 5, 1995

[54] EXPOSURE METHOD

[75] Inventors: Yoshichika Iwamoto, Kumagaya; Hiroki Tateno, Kawasaki, both of Japan

[73] Assignee: Nikon Corporation, Tokyo, Japan

[21] Appl. No.: 359,016

[22] Filed: Dec. 19, 1994

Related U.S. Application Data

[63] Continuation of Ser. No. 172,099, Dec. 23, 1993.

[30] Foreign Application Priority Data

Dec. 25, 1992 [JP]  Japan .................................. 4-346072

[51] Int. Cl.⁶ ............................................. G03B 27/42
[52] U.S. Cl. ...................................................... 355/53
[58] Field of Search ..................................... 355/52, 53

[56] References Cited

U.S. PATENT DOCUMENTS

| | | | |
|---|---|---|---|
| 4,629,313 | 12/1986 | Tanimoto | 355/53 |
| 4,666,273 | 5/1987 | Shimizu et al. | 353/101 |
| 4,677,301 | 6/1987 | Tanimoto et al. | 250/548 |
| 4,780,617 | 10/1988 | Umatate et al. | 250/548 |
| 4,833,621 | 5/1989 | Umatate | 364/491 |
| 4,871,237 | 10/1989 | Anzai et al. | 350/419 |
| 5,117,255 | 5/1992 | Shiraishi et al. | 355/53 |
| 5,305,222 | 4/1994 | Nakamura | 355/53 |

Primary Examiner—Monroe H. Hayes
Attorney, Agent, or Firm—Shapiro and Shapiro

[57] ABSTRACT

An exposure method for aligning a plurality of shot areas arranged on a substrate with predetermined exposure positions on a predetermined coordinate system in turn and transcribing, on the substrate, a pattern formed on a mask through a projection optical system comprises the steps of measuring, on a predetermined coordinate system, coordinates of a plurality of sample shot areas selected from a plurality of shot areas, determining weight coefficients corresponding to the coordinates of the sample shot areas, performing statistical calculation based on the coordinates and the weight coefficients of the measured sample shot areas and determining coordinates of the i-th shot area on the predetermined coordinate system, controlling the movement of the substrate according to the determined coordinates of the i-th shot area to set the i-th shot area at the exposure position, and adjusting the projection magnification of the projection optical system based on a parameter expressing deformation of the shot area among a plurality of parameters obtained by statistical calculation upon determining the coordinates of the shot areas.

25 Claims, 6 Drawing Sheets

EXPOSURE METHOD

This is a continuation of application Ser. No. 08/172,099 filed Dec. 23, 1993, now abandoned.

BACKGROUND OF THE INVENTION

1. Field of the Invention

The present invention relates to an exposure method for transferring a mask pattern on a plurality of shot areas arranged on a substrate through a projection optical system.

2. Related Background Art

In a projection exposure apparatus of a step and repeat type known as a stepper, a plurality of shot areas or chip pattern areas arranged on a substrate such as a semiconductor wafer or a glass plate are aligned in turn with predetermined positions, i.e., projection positions of a pattern of a mask (reticle) in stationary coordinates which are orthogonal coordinates defined by a pair of interferometers and which defines moving positions of the substrate. It is demanded that the alignment accuracy must always be high and stable in order to prevent the yield due to production of poor chips in the manufacturing process from being lowered. As disclosed in the U.S. Pat. Nos. 4,780,617 and 4,833,621, the enhanced global alignment method (EGA method) is mainly used to calculate the regularity of the shot arrangement on a wafer accurately by employing a statistical calculation in the stepper.

In the EGA method, the coordinate positions of only a plurality of shot areas-(three or more areas are required, normally about 10 to 15 areas) selected as sample shots on a single wafer are measured. After the coordinate positions of all the shot areas on the wafer are calculated from these measurement values using statistic calculation processing (method of least squares), stepping of a wafer stage is uniquely executed according to the calculated shot alignment. The EGA method requires only a shot measurement time, and an averaging effect for random measurement errors can be expected.

The statistic processing method used in the EGA method will be briefly described below. Designed alignment coordinates of m (m is an integer satisfying $m \geq 3$) sample shots on a wafer are represented by $(X_n, Y_n)$ (n=1, 2, ..., m), and a linear model given by the following equation is assumed for a shift $(\Delta X_n, \Delta Y_n)$ from the designed alignment coordinates.

$$\begin{pmatrix} \Delta X_n \\ \Delta Y_n \end{pmatrix} = \begin{pmatrix} a & b \\ c & d \end{pmatrix} \begin{pmatrix} X_n \\ Y_n \end{pmatrix} + \begin{pmatrix} e \\ f \end{pmatrix} \quad (1)$$

Furthermore, if actual alignment coordinates (measurement values) of the m sample shots are represented by $(\Delta x_n, \Delta y_n)$, a square sum E of residuals obtained upon application of this model is expressed by:

$$E = \Sigma\{(\Delta x_n - \Delta X_n)^2 + (\Delta y_n - \Delta Y_n)^2\} \quad (2)$$

Thus, parameters a to f for minimizing this equation need only be obtained. In the EGA method, the alignment coordinates of all shot areas on a wafer are calculated on the basis of the parameters a to f calculated as described above and the designed alignment coordinates.

Since wafers are deformed during treatments such as heat treatment in the semiconductor production line, the size and thus the shape of shot areas on a wafer are also varied. If, therefore, the imaging optical characteristics of the projection optical system such as the projection magnification and the distortion are previously adjusted to the predetermined values and the shot areas are set at the exposure position by using the EGA method, the projection image of the reticle pattern and the shot areas are likely not to overlap accurately with each other over all ranges. In order to overcome this problem, there has been proposed a method in which a plurality of alignment marks on the reticle and a plurality of alignment marks on the wafer corresponding to them are detected by an alignment sensor employing the through-the-reticle method (TTR method), the magnification errors and then the distortion errors of the pattern image in the shot areas are obtained from the displacements between the corresponding marks, and the imaging optical characteristics of the projection optical system are adjusted so as to diminish these errors.

In the conventional technology, however, the magnification error and the distortion error of every shot area must be measured by means of the alignment sensor, and this lowers the throughput of the exposure apparatus. If any alignment marks attached to shot areas are broken in any treatment processes, the magnification errors and the distortion errors of the shot areas cannot be measured accurately, thereby lowering the overlapping accuracies between the shot areas and pattern images.

Furthermore, the EGA method processes shot alignment errors on a wafer as linear errors. In other words, the EGA calculation is a linear approximation. For this reason, the EGA method cannot cope with a variation in local alignment errors on a wafer, i.e., non-linear factors.

SUMMARY OF THE INVENTION

The present invention was made to overcome these problems and the object thereof is to provide an exposure method for overlapping the whole area of the projection image of a reticle pattern accurately with all shot areas on a wafer.

In order to achieve this object in an aspect of the present invention, there is provided an exposure method for aligning a plurality of shot areas arranged on a substrate with predetermined exposure positions on a predetermined coordinate system in turn and transcribing, on the substrate, a pattern formed on a mask through a projection optical system, the exposure method comprising the steps of:

measuring, on a predetermined coordinate system, coordinates of a plurality of sample shot areas selected from a plurality of shot areas;

determining weight coefficients corresponding to the coordinates of the sample shot areas;

performing statistical calculation based on the coordinates and the weight coefficients of the measured sample shot areas and determined coordinates of the i-th shot area on the predetermined coordinate system;

controlling the movement of the substrate according to the determined coordinates of the i-th shot area to set the i-th shot area at the exposure position; and adjusting the projection magnification of the projection optical system based on a parameter expressing deformation of the shot area among a plurality of parameters obtained by the statistical calculation upon determining the coordinates of the shot areas.

According to the present invention, each of the shot areas (sample shot areas) on the substrate is given a weight and then the statistic calculation is carried out in the shot area. Thus, if the substrate has non-linear lines, the coordinates of the i-th shot area can be determined accurately. Moreover, as the projection magnification is adjusted by using the parameter indicating deformation obtained from the statistical calculation for the i-th shot area, the whole projection image of the mask pattern overlaps accurately with the i-th shot area. Furthermore, the distorted value of the i-th shot area is calculated from the coordinates of at least two shot areas adjacent to the i-th shot area and the distortion is corrected corresponding to the calculated distorted value. Thus, the overlapping accuracy between the i-th shot area and the projection image of the mask pattern is improved much as compared with the case where only the projection magnification is adjusted.

According to the present invention, therefore, the whole shot areas and the whole pattern image can overlap with each other without lowering throughput even if magnification errors and distortion errors occur between the shot areas on the substrate and the image of the mask pattern due to deformation of the substrate and the adjustment error of the imaging optical characteristics of the projection optical system in the previous layer such as the projection errors and distortion in particular. Furthermore, even if a substrate has non-linear distortion, the shot areas are aligned with the exposure positions very accurately at a high speed.

In order to achieve this object in another aspect of the present invention, there is provided an exposure method for aligning a plurality of shot areas arranged on a substrate with predetermined exposure positions on a predetermined coordinate system in turn and transcribing, on the substrate, a pattern formed on a mask through a projection optical system, the exposure method comprising the steps of:

measuring, on a predetermined coordinate system, coordinates of a plurality of sample shot areas selected from a plurality of shot areas;

determining coordinates of the shot areas on the predetermined coordinate system by performing statistical calculation due to the measured coordinates of the sample shot areas; and adjusting magnification of the projection optical system based on one or more parameters among a plurality of parameters calculated by the statistical calculation.

With this method, the whole area of the projection image of the mask pattern can overlap with the shot areas accurately.

DETAILED DESCRIPTION OF THE PREFERRED EMBODIMENTS

Figure 1:
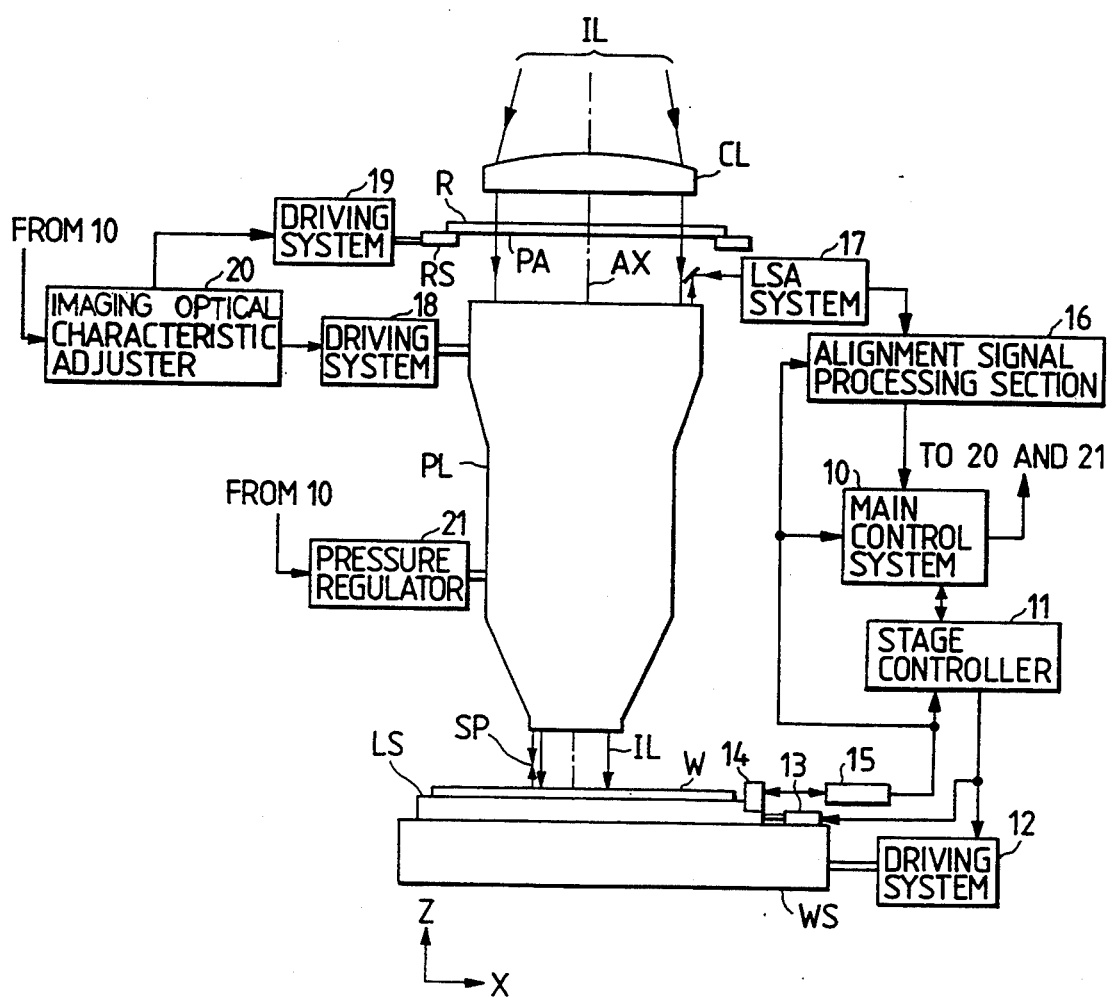
FIG. 1 shows a general structure of a preferable projection exposure apparatus with which an exposure method according to the present invention is performed.
Figure 2:
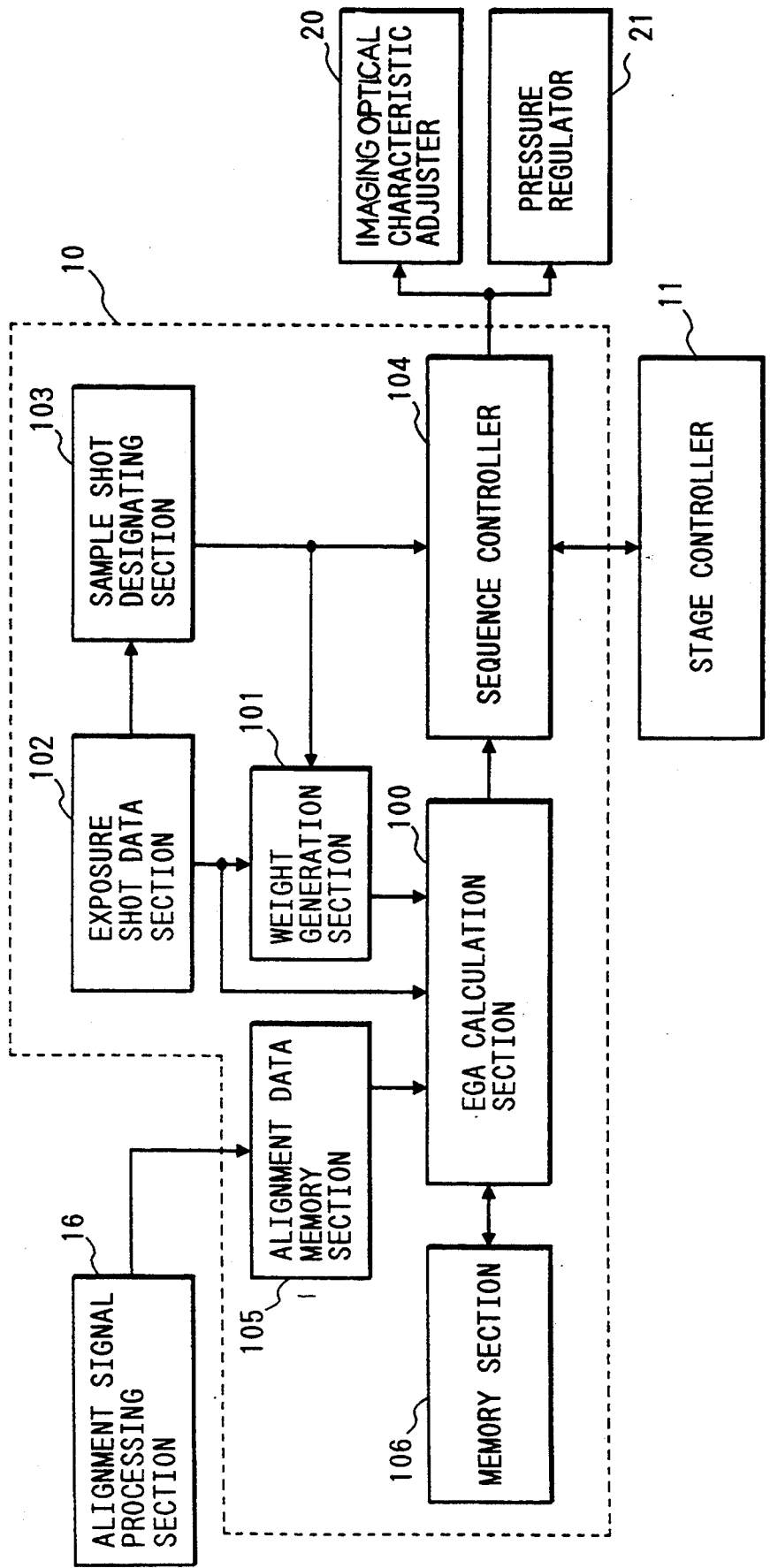
FIG. 2 is a block diagram of the control system of the apparatus shown in FIG. 1.

FIG. 1 shows a general structure of a preferable projection exposure apparatus with which an exposure method according to the present invention is performed, and FIG. 2 shows a block diagram of a control system of the projection exposure apparatus shown in FIG. 1. As shown in FIG. 1, illuminating light IL (i-rays, KrF excimer laser, etc.) from an exposure illuminating system (not shown) is incident at substantially even illuminance on a pattern area PA of a reticle R mounted on a reticle stage RS through a condenser lens CL. The reticle stage RS is moved by a driving system 19 two-dimensionally on a plane perpendicular to the optical axis AX of a projection optical system PL and is adjustable finely along the optical axis (in the Z directions). The illuminating light IL which has passed through the pattern areas PA enters the projection optical system PL which is telecentric at both sides, and the projection optical system PL projects and focuses the image of a circuit pattern formed on the pattern area PA, on a wafer W having a resist layer formed on the surface. The wafer W is mounted on a stage LS by a Z wafer holder (not shown). The Z stage LS is adjusted finely along the optical axis of the projection optical system PL by a driving system 13 and can be inclined in arbitrary directions. The Z stage LS is mounted on a wafer stage WS which can make step-and-repeat movement in the X and Y directions, i.e., two-dimensionally. The position of the wafer stage WS as measured in the X and Y directions is always detected by a laser interferometer 15 at a resolving power of about 0.01 µm, for example. To an end portion of the Z stage is fixed a movable mirror 14 for reflecting laser beams from the interferometer 15.

In FIG. 1 is shown a laser step alignment system (LSA system) 17 of a TTL type for detecting an alignment mark on the wafer W. As disclosed in the U.S. Pat. No. 4,677,301, the LSA system 17 forms an elongated stripe-like spot SP extending in the X direction on the wafer. Diffracted light (or scattered light) produced from the mark is detected photoelectrically, when the spot light SP and the alignment mark (diffraction grating mark) attached to the corresponding shot area are moved relatively in Y direction by finely moving the wafer stage WS. Only the LSA system for detecting the position of the alignment mark in the Y direction is shown in FIG. 1. Actually, however, another set of an LSA system for detecting the position in the X direction is provided. A photoelectric signal from the LAS system 17 together with a position signal from the interferometer 15 is inputted to an alignment signal processing section 16 and is processed in accordance with predetermined mathematical operation in the section 16 to detect the position of the alignment mark. The detected information is outputted to a main control system 10.

The projection optical system PL comprises a plurality of lens elements. At least one of the lens elements which is close to the reticle R can be moved by a plurality of piezo elements. A driving system 18 independently drives the piezo elements so as to move the lens element along the optical axis or incline the same. A imaging optical characteristic adjuster 20 adjusts the imaging optical characteristics of the projection optical system PA, particularly the projection magnification and distortion by driving the lens element by means of the driving system 18 in accordance with instructions from the main control system 10 and/or by inclining the reticle R by means of the driving system 19. The imaging optical characteristic adjuster having the above-mentioned structure is disclosed in the U.S. Pat. No. 5,117,255, etc., and detailed description thereof is omitted.

As disclosed in the U.S. Pat. Nos. 4,871,237 and 4,666,273, a pressure regulator 21 controls the pressure in a sealed space defined between two of the lens elements constituting the projection optical system PL, and alters the imaging optical characteristics (the projection in particular) of the projection optical system PL. As disclosed in the U.S. Pat. No. 4,629,313, the projection magnification and distortion are obtained from relative positional relationship of the marks of the test reticles by detecting the positions of the marks by means of a slit plate on the wafer stage and a photoelectric detector. In this condition, the above-mentioned measurements are previously made by the main control system 10, and the projection magnification and the distortion are adjusted to predetermined values by means of the pressure regulator 21.

The main control system 10 executes EGA calculation based on the position information from a signal processing section 16 as will be described later to calculate the coordinates of all shot areas on the wafer W, obtains the sizes (magnification errors) and distorted values of the shot areas from the calculated results, and controls the whole apparatus including the imaging optical characteristic adjuster 20 and the pressure regulator 21. A stage controller 11 controls the drive of the wafer stage WS by a driving system 12 by using the position information from the interferometer 15 in accordance with the drive instructions from the main control system 10.

Referring to FIG. 2, the concrete structure of the main control system 10 will be described. An photoelectric signal from the LSA system 17 and a position signal from the interferometer 15 are inputted to the alignment signal processing section 16. The positions of the alignment marks in the shot areas (i.e., the coordinates defined on the orthogonal coordinates by the interferometer 15) are detected by the section 16 by performing the predetermined mathematical calculation. The mark information from the alignment processing section 16 can be inputted to an alignment data memory section 105.

An EGA calculation section 100 defines the coordinates of all shot areas on the wafer W by performing statistical calculation based on the coordinates of a plurality of (three or more, usually 10 to 15) shot areas (sample shot areas) memorized in a memory section 105 and the weights determined by a weight generation section 101. Distorted values of the shot areas area obtained from the thus calculated coordinates of the shot areas, and the resultant information is supplied to a sequence controller 104. To the memory section 106 can be inputted the shot arrangement, calculation parameters, distorted values, etc. In an exposure shot data section 102 are stored coordinates for designing the shot areas to be exposed on the wafer W, and the resultant information is outputted to the EGA calculation section 100, the weight generation section 101 and a sample shot designating section 103. The sample shot designating section 103 determines the sample shot to be used for the EGA calculation based on the position information from the data section 103. The information (number, positions) concerning the arrangement of the sample shots is supplied to the weight Generation section 101 and the sequence controller 104.

The weight generation section 101 executes the mathematical calculation in accordance with weight functions given by equations (4) and (6) as will be described later and determining equations (7) and (8) as will also be described later and determines the weight functions based on the value of a parameter S (i.e., a weight parameter or a correction coefficient C) inputted from the sequence controller 104 or by the operator. Furthermore, the determined weight functions determine per shot area the weight which is to be given to the alignment data of each sample shot, based on the shot position supplied from the data section 102 and the sample shot arrangement supplied from the designating section 103. The weight is supplied to the EGA calculation section 100. The sequence controller 104 determines a series of processes for controlling the movement of the wafer stage WS at the time of alignment or at the time of the exposure of a step-and-repeat type based on the various pieces of data. Furthermore, the sequence controller 104 controls the imaging optical characteristic adjuster 20 and the pressure regulator 21 according to the scaling parameters and the distorted values of the shot areas among a plurality of calculated parameters obtained from the EGA calculation section 100 so as to adjust the projection magnification and the distortion. The sequence controller also controls the whole apparatus.

Figure 8:
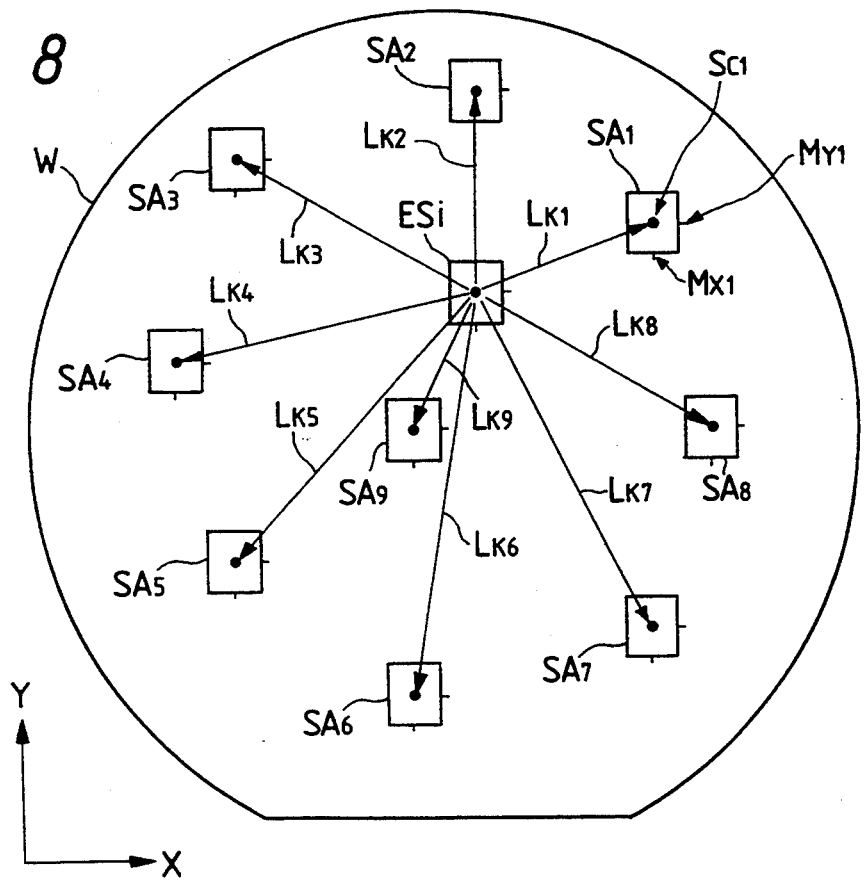
FIG. 8 illustrates the principle of the first alignment system preferred to the exposure method of the present invention.
Figure 9:
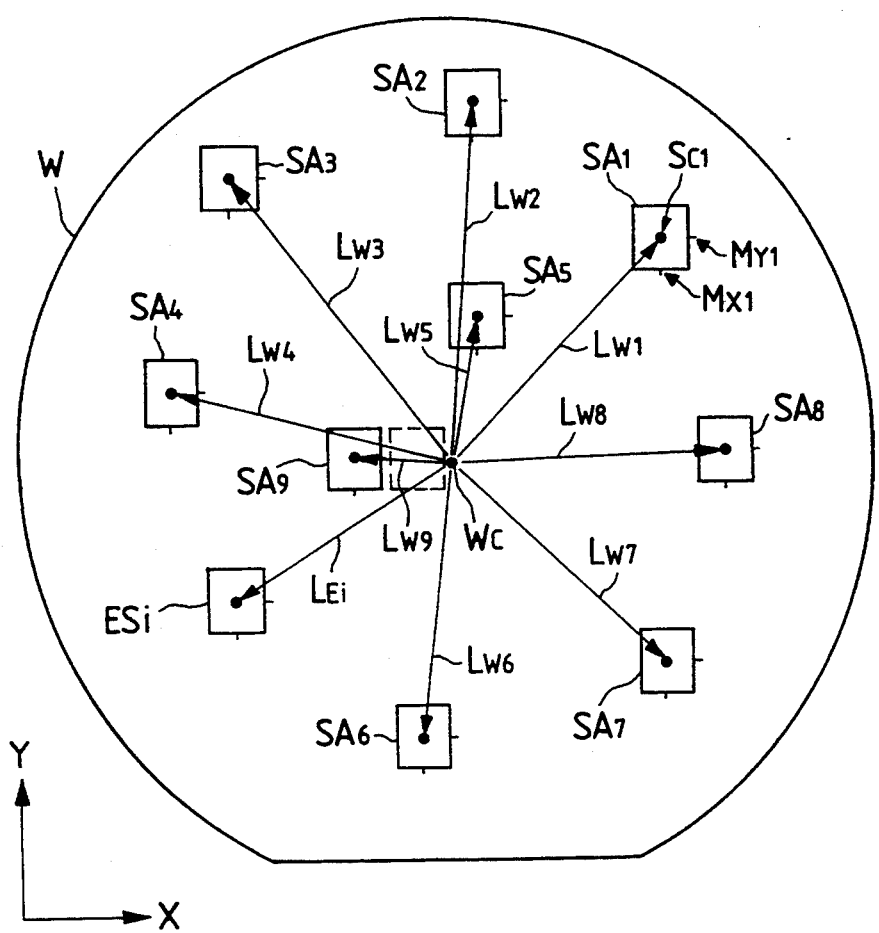
FIG. 9 illustrates the principle of the second alignment system preferred to the exposure method of the present invention.

The alignment method used in the apparatus shown in FIG. 1 will be described. This method is effective in wafers having non-linear distortion and is described in the U.S. patent application Ser. No. 005,146 filed on Jan. 15, 1993 by the inventors of the present invention. This alignment method will be described with reference to FIGS. 8 and 9.

The first alignment method is effective in "regular non-linear distortion" and based on the fact that "the arrangement errors of local areas on a substrate are approximately the same when the substrate has regular non-linear distortion." The first alignment method ($W_1$-EGA method) will be detailed.

The $W_1$-EGA process is based on the conventional EGA method, and is characterized in that when the coordinate position of an i-th shot area ESi on a wafer W is determined, alignment data (coordinate positions) of m (m=9 in FIG. 1) sample shots $SA_1$ to $SA_9$ are multiplied with a weighting coefficient $W_{in}$ in accordance with distances $L_{k1}$ to $L_{k9}$ between the area ESi and the nine sample shots $SA_1$ to $SA_9$. In this embodiment, after alignment marks ($M_{x1}, M_{y1}$) of each sample shot are detected using an alignment sensor, a square sum Ei of residuals are evaluated by the following equation (equation (3)) as in equation (2) above, and calculation parameters a to f can be determined to minimize equation (3). In this process, although the same sample shots are used for each shot area, since the distance to each sample shot inevitably varies in correspondence with shot areas, the weighting coefficient $W_{in}$ to be multiplied with the coordinate position of the sample shot changes in units of shot areas. For this reason, the parameters a to f are determined in units of shot areas to calculate the coordinate positions of the shot areas, thereby determining the coordinate positions of all the shot areas.

$$Ei = \sum_{n=1}^{m} W_{in}\{(\Delta x_n - \Delta X_n)^2 + (\Delta y_n - \Delta Y_n)^2\} \quad (3)$$

In this embodiment, the weighting coefficient $W_{in}$ for alignment data of each sample shot is changed in units of shot areas on the wafer W. For this reason, the weighting coefficient Win is expressed as a function of a distance $L_{kn}$ between the i-th shot area ESi and an n-th sample shot $SA_n$.

$$W_{in} = \frac{1}{\sqrt{2\pi s}} e^{-L_{kn}^2/2S} \quad (4)$$

where S is a parameter for changing the degree of weighting.

As can be seen from equation (4), as the distance $L_{kn}$ between a sample shot and the i-th shot area ESi is shorter, the weighting coefficient $W_{in}$ to be multiplied with the alignment data (coordinate position) of the sample shot is increased.

When the value of the parameter S in equation (4) is sufficiently large, the statistic calculation processing result becomes almost equal to that obtained by the conventional EGA method. On the other hand, when all shot areas to be exposed on a wafer are selected as sample shots, and the value of the parameter S is sufficiently close to zero, the statistic calculation processing result becomes almost equal to that obtained by the so-called die-by-die method (D/D method) which performs alignment per shot. In the $W_1$-EGA process, therefore, when the value of the parameter S is appropriately set, an intermediate effect between the EGA method and the D/D method can be obtained.

For example, when the parameter S is set to have a small value for a wafer having a large non-linear component, an effect (accuracy of alignment) substantially equivalent to that of the D/D method can be obtained. In this regard, the $W_1$-EGA process can satisfactorily remove alignment errors caused by non-linear components. When the alignment sensor has poor measurement reproducibility, an effect almost equivalent to that of the EGA method can be obtained by setting the parameter S to have a large value, and alignment errors can be eliminated by an averaging effect. As described above, the effect of this embodiment can be changed from the EGA method to the D/D method by appropriately altering the value of the parameter S. Therefore, alignment is flexibly changed in accordance with, e.g., the characteristic (e.g., the magnitude, rule, or the like) of a non-linear component, the step pitch, the measurement reproducibility of the alignment sensor, or the like in correspondence with various layers and components (X- and Y-directions). Thus, alignment can be performed under optimal conditions corresponding to the layers.

The $W_2$-EGA process is also based on the EGA method, and is characterized in that alignment data of m sample shots $SA_1$ to $SA_9$ (m=9 in FIG. 9), are multiplied with a weighting coefficient $W_{in}$, according to a distance (radius) $L_{Ei}$ between the center point of deformation (the center point of symmetry) as a point of interest on the wafer, i.e., the wafer center $W_c$ and an i-th shot area ESi on the wafer W and distances (radii) $L_{w1}$ to $L_{w1}$ between the wafer center $W_c$ and the nine sample shots $SA_1$ to $SA_9$. In the $W_2$-EGA process, after alignment marks ($M_{x1}$, $M_{y1}$) of each sample shot are detected using an alignment sensor, a square sum Ei' of residuals are evaluated by the following equation (equation (5)), and calculation parameters a to f, can be determined to minimize equation (5). In this process, since the weighting coefficient $W_{in}'$ to be multiplied with the positions of the coordinates changes in units of shot areas like in the first embodiment, a statistic calculation is executed in units of shot areas to determine the parameters a to f, thereby determining the coordinate positions of the shot ares to find the coordinates.

$$Ei' = \sum_{n=1}^{m} W_{in}'\{(\Delta x_n - \Delta X_n) + (\Delta y_n - \Delta Y_n)^2\} \quad (5)$$

In order to change the weighting coefficient $W_{in}'$ for each sample shot in units of shot areas on the wafer W, the weighting coefficient $W_{in}'$ is expressed as a function of the distance (radius) $L_{Ei}$ between the i-th shot area ESi on the wafer W and the wafer center $W_c$ as follows:

$$W_{in}' = \frac{1}{\sqrt{2\pi s}} e^{-(L_{Ei}-L_{Wn})^2/2S} \quad (6)$$

where S is a parameter for changing the degree of weighting.

As can be seen from equation (6), as the distance (radius) $L_{Wn}$ between a sample shot and the wafer center $W_c$ is closer to the distance (radius) $L_{Ei}$ between the wafer center $W_c$ and the i-th shot area ESi on the wafer W, the weighting coefficient $W_{in}'$ to be multiplied with the alignment data is increased. In other words, a largest weighting coefficient $W_{in}'$ is multiplied with alignment data of a sample shot located on a circle having the wafer center $W_c$ as its center and the radius $L_{Ei}$, and the weighting coefficient $W_{in}'$ for alignment data is decreased as the sample shot is radially separated away from the circle.

In the $W_1$-EGA process and the $W_2$-EGA process (hereinafter merely referred to as the W-EGA process if unnecessary to be specified), the degree of weighting for alignment data of each sample shot can be changed by the parameter S. A method of determining the parameter S will be described below. For example, when an operator sets a weighting parameter D to be a predetermined value, the parameter S, i.e., the weighting coefficient $W_{in}$ or $W_{in}'$, is automatically determined from equation (7):

$$S = \frac{D^2}{8 \cdot \log \cdot 10} \quad (7)$$

In this case, the weighting parameter D physically means a sample shot zone (to be simply referred to as a zone hereinafter) effective for calculating the coordinate positions of shot areas on a wafer. Therefore, when the zone is wide, since the number of effective sample shots is increased, a result obtained in this case becomes close to that obtained by the EGA method. Conversely, when the zone is narrow, since the number of effective sample shots is decreased, a result obtained in this case becomes close to that obtained by the D/D method.

An equation for determining the parameter S is not limited to equation (7), and the following equation (8) may be used.

$$S = \frac{A}{m - C} \quad (8)$$

where A is the area (unit=mm²) of the wafer, m is the number of sample shots, and C is a correction coefficient (positive real number).

In equation (8), since a change in wafer size (area) or the number of sample shots is reflected in determination of the parameter S, an optimal value of the correction coefficient C to be used in determination is prevented from being varied largely. When the correction coefficient C is small, since the value of the parameter S is increased, a result obtained in this case becomes close to that obtained by the EGA method as in the case of equation (7). Conversely, when the correction coefficient C is large, since the value of the parameter S is decreased, a result obtained in this case becomes close to that obtained by the D/D method as in the case of equation (7).

The exposure sequence of the first embodiment according to the present invention will be explained. In this embodiment, the $W_1$-EGA method is applied to a wafer having non-linear distortion to correct a multiplication error of a projection image of a reticle pattern in a shot area on the wafer. The values of parameters S, i.e., weight parameters D or correction coefficients C have previously been optimized for each wafer and the weight generation section 101 has already determined the weight function defined by equation (4) according to the optimized parameters S.

In the projection exposure apparatus as shown in FIGS. 1 and 2, the sequence controller 104 executes a subalignment by using two sets of LSA systems according to sample shot arrangements determined by the designating section 103. In other words, the sequence controller detects two sets of alignment marks provided on each of all sample shots. The designating section 103 has determined the number and the positions of the sample shots so that the sample shots are distributed evenly on the whole surface of the wafer. The signal processing section 16 receives a photoelectric signal from the LSA system 17, obtains the coordinates of each mark and is outputted to the memory section 105.

The weight generation section 101 finds a weight given to the coordinates of each sample shot by using the optimized weight function according to the sample shot arrangement obtained from the designating section 103 per shot area and outputs the weight to the EGA calculation section 100. The EGA calculation section 100 executes statistical calculation (method of least squares) with the coordinates of each sample shot of the memory section 105 for each shot area weighed and calculates the calculation parameters a to f by using equation (3). The EGA calculation section 100 determines the coordinates of all shot areas by using the calculation parameters a to f for all shot areas and their designed coordinates from the data section 102 and outputs them to the sequence controller 104 and the memory section 106.

In the EGA calculation of the W-EGA type, the amounts of scaling Rx and Ry of a wafer in the X and Y directions, the amounts of off-set Ox and Oy of the wafer in the X and Y diections, the residual rotation error $\theta$ of the arrangement coordinate system of a shot area and the inclination (degree of orthogonality) $\omega$ are introduced as variables which are expressed by:

Rx=a
Ry=d
Ox=e
Oy=f
$\theta$=c/d
$\omega$=−(b/a+c/d).

In the W-EGA process, the amounts of scaling Rx and Ry which are found from the calculation parameters a to f for the corresponding shot areas are considered expansion and contraction rates of the shot areas. The projection magnification of the projection optical system PL is adjusted by the imaging optical characteristic adjuster 20 or the pressure regulator 21 according to the amounts of scaling Rx and Ry, i.e., the calculation parameters a and f to diminish the magnification error of the projection image of the reticle pattern with respect to the respective shot area or to reduce the error to a value smaller than the tolerance.

After the coordinates of all shot areas have been determined in the EGA calculation section 100, the wafer stage WS is set in position by the sequence controller 104 according to the coordinates of the first shot area on the wafer, and the projection magnification of the optical system PL is adjusted by the imaging optical characteristic adjuster 20 or the pressure regulator 21 according to the calculation parameters a and d of the area. As the calculation parameters a and d are the elongation and contraction rates themselves (the unit being the order of ppm), the projection magnification of the projection optical system PL can be changed by the sequence controller 104 by the same amount of the elongation and contraction rate. The projection magnification of the projection optical system PL is adjusted before the shot area is set at the exposure position, more specifically, during the stepping movement of the wafer stage WS. The same processes are repeated for the second shot area and the following shot areas, whereby the whole area of the projection image of the reticle pattern overlaps with all shot areas on a wafer W at a high accuracy. In this condition, the center of each shot area aligns with the center of the projection image of the reticle pattern (the optical axis AX of the projection optical system PL) accurately. As a result, the overlapping accuracy between the whole area of the shot area and the projection image of the reticle pattern can be improved without lowering the throughput.

In this embodiment, the projection magnification of the projection optical system PL can be adjust either by the imaging optical characteristic adjuster 20 or by the pressure regulator 21. Alternatively, the adjustment of the projection magnification can be made by both the imaging optical characteristic adjuster 20 and the pressure regulator 21. Such adjustment is particularly effective in the case where an amount of adjustment (an amount of change) of the magnification between adjacent shot areas becomes large. When the amounts of scaling Rx and Ry are equal upon magnification adjustment, the magnification adjustment can be made in accordance with these values (elongation and contraction rates). Even if, however, either the imaging optical characteristic adjuster 20 or the pressure regulator 21 is used, the magnifications in the X and Y directions cannot be independently set to different values if other means is not provided. Thus, when the amounts of scalings Rx and Ry are different from each other, the magnification is adjusted to a value in accordance with the average of them.

Alternatively, the scalings Rx and Ry are multiplied by the weight coefficients defined by the pattern line widths in the X and Y directions, pitches and the like and the sum of the weighted scalings Rx and Ry is averaged by the sum of the weight coefficients, $\omega_1$ and $\omega_2$, as $$\frac{(\omega_1 \times R_x) + (\omega_2 \times R_y)}{\omega_1 + \omega_2}.$$

The magnification can be adjusted in accordance with the average value (the value which is the sum of the weighted scalings Rx and Ry averaged by the sum of the weight coefficients). When, however, a mechanism for bending the reticle R is used to bend the reticle R properly and either the focus character adjuster 20 or the pressure regulator 21 is used, the magnifications in the X and Y directions can be adjusted independently. Since the aberrations of the projection optical system PL can be changed by the amount of flexure of the reticle R, the imaging optical characteristic adjuster 20 is preferably used to suppress variations of the aberrations.

In this embodiment, the magnification of the projection optical system PL is adjusted in accordance with the calculation parameters a and d for each shot area. However, each shot area on a wafer is divided into a plurality of blocks and the magnification adjustment for every block can be carried out. The average of the parameters a and d of all shot areas in the same block or the maximum value and the minimum value of the parameters in the blocks may be used as new amounts of scalings Rx and Ry, i.e., new calculation parameters a and d for each block.

In another way, differences (arrangement errors) between the coordinates (calculated values) of the shot areas calculated by the W-EGA process in the EGA calculation section 100 and the designed values of the coordinates of the shot areas may be obtained, and the magnification adjustments may be made only for the shot areas whose the magnification changes are large. Conversely, if the arrangement errors are small, the magnification changes in the shot areas are also small and it is considered unnecessary to adjust the magnification of these shot areas.

In a further way, when the magnification adjustment is not influenced so much by the degree of the deformation (elongation and contraction), the calculation parameters a and d of all shot areas on a wafer are averaged or the maximum value and the minimum values of the calculation parameters a and d are averaged so that the magnification can be adjusted by a single process based on the average.

In all methods as described above, the magnification adjustment is made by using calculation parameters per shot area in the W-EGA process. However, the calculation parameters a to f common to the whole area of a wafer can be obtained by executing the EGA-process, for example. In this case, the EGA-process is used in the EGA calculation section 100, and a set of calculation parameters a to f are obtained from equation (2) by using at least three sets of coordinates of the sample shots selected from the coordinates of all sample shots stored in the memory section 105. Thereafter, the magnification can be adjusted in a single step before exposure in response to the scaling parameters a and d selected from the thus obtained calculation parameters a to f. In this case, the EGA process is used to adjust the magnification but the coordinates calculated by means of the W-EGA process is employed to set the shot areas at the exposure position.

In a still further way, it is possible that the magnification is previously adjusted before exposure according to the calculation parameters a and d obtained by the EGA process as described above, the wafer stage WS is set in position according to the coordinates of the shot areas calculated by performing the W-EGA process as in the previous embodiment upon the overlapping exposure, and the magnification adjustment per shot area is performed according to the calculation parameters a and d for each shot area. In this case, the magnification adjustment before the exposure can be carried out by the imaging optical characteristic adjuster 20, and the magnification adjustment per shot area can be effected by the pressure regulator 21. The projection magnification is adjusted roughly before the exposure. Thus, it is advantageous that the amount of adjustment of the magnification, i.e., the moving amount of the lens elements by means of the imaging optical characteristic adjuster 20 or the amount of pressure adjustment by means of the pressure regulator 21 is small.

In this embodiment, the first shot area is set at the exposure position and the overlapping exposure is initialized, after the coordinates of all shot area on a wafer have been obtained. However, at the time when the EGA calculation section 100 calculates the coordinates of the first shot area $ES_1$ (FIG. 3) by executing the W-EGA process, the sequence controller 104 immediately sets the shot area $ES_1$ at the overlapping position, and adjusts the magnification according to the calculation parameters a and d so as to perform overlapping exposure in the shot area $ES_1$. On the other hand, after calculating the coordinates of the shot area $ES_1$, the EGA calculation section 100 may obtain the second shot area and the following shot areas in turn in parallel with a series of operation of the sequence controller 104 and may perform overlapping exposure on the second shot areas and the following shot areas in turn according to the coordinates given by the EGA calculation section 100 in turn. In this case, the magnification adjustment per shot area is carried out during the stepping movement of the wafer stage WS. In this sequence, the same throughput given by the conventional EGA-process can be obtained even if the above-mentioned W-EGA process is adopted and the magnification is adjusted per shot area.

Figure 4A:
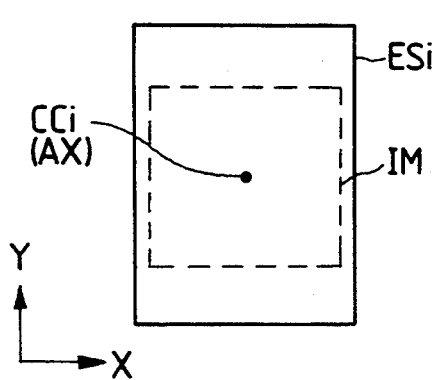
FIGS. 4A and 4B illustrate how to adjust magnification by the exposure method of the second embodiment of the present invention.

The exposure sequence according to the second embodiment of the present invention will be described. In this embodiment, the $W_1$-EGA-process is used when wafers having non-linear distortion are to be treated, but the method of adjusting the projection image of a reticle pattern with respect to shot areas is different from that of the first embodiment. The differences between the first and second embodiments will be described. For simplicity of the explanation of this embodiment, it is assumed that a shot area has been thermally deformed from a square shape to a rectangular one. FIG. 4A exaggeratedly shows a magnification error produced between the i-th shot area ESi and the projection image IM of a reticle pattern, in which it is assumed that the center CC1 of the shot area ESi aligns with the center (the optical axis AX of the projection optical system PL) of the projection image IM.

In the projection exposure apparatus as shown in FIGS. 1 and 2, the sequence controller 104 executes sample alignment by using two sets of LSA systems according to the sample shot arrangement given by the designating section 103. The signal processing section 16 receives a photoelectric signal from the LSA system 17, finds coordinates of the corresponding mark and outputs them to the memory section 105. Thereafter, the EGA process is applied to the operation of the EPC calculation section 100 as mentioned above, and the calculation parameters a to f are obtained from equation (2) by using the coordinates of at least three sample shots stored in the memory section 105. In this case, the EGA calculation section 100 may be designed to select such at least three samples from the sample shots distributed evenly on the whole area of the wafer as form a polygon at the peripheral portions of the wafer and may read out the coordinates of the selected sample shots from the memory section 105.

Figure 4B:
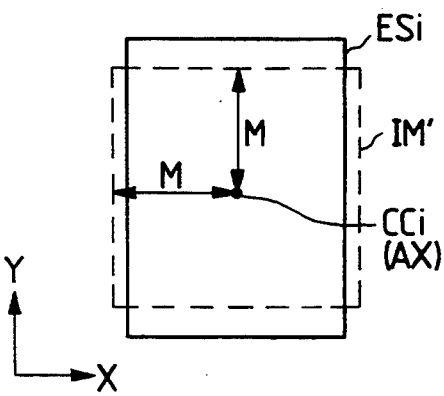

The sequence controller 104 adjusts the projection magnification of the projection optical system PL through the imaging optical characteristic adjuster 20 or the pressure regulator 21 in response to the parameters a and d from the EGA calculation section 100, whereby adjustment of the magnification takes place corresponding to the average elongation and contraction of the whole area of the wafer, i.e., rough adjustment of the projection magnification for the shot areas. As a result, the magnification of the projection image IM of the reticle pattern projected on the i-th shot area ESi on the wafer changes from the state shown in FIG. 4A to the state shown in FIG. 4B. The sequence controller 104 previously finds the size of the magnification-adjusted projection image IM', i.e., the distance between the center AX of the projection image IM' to its peripheral portions from the projection magnification before the adjustment (corresponding to the predetermined value) and its adjustment rate (i.e., the parameters a and d) and memorizes the size of the IM'.

Figure 5:
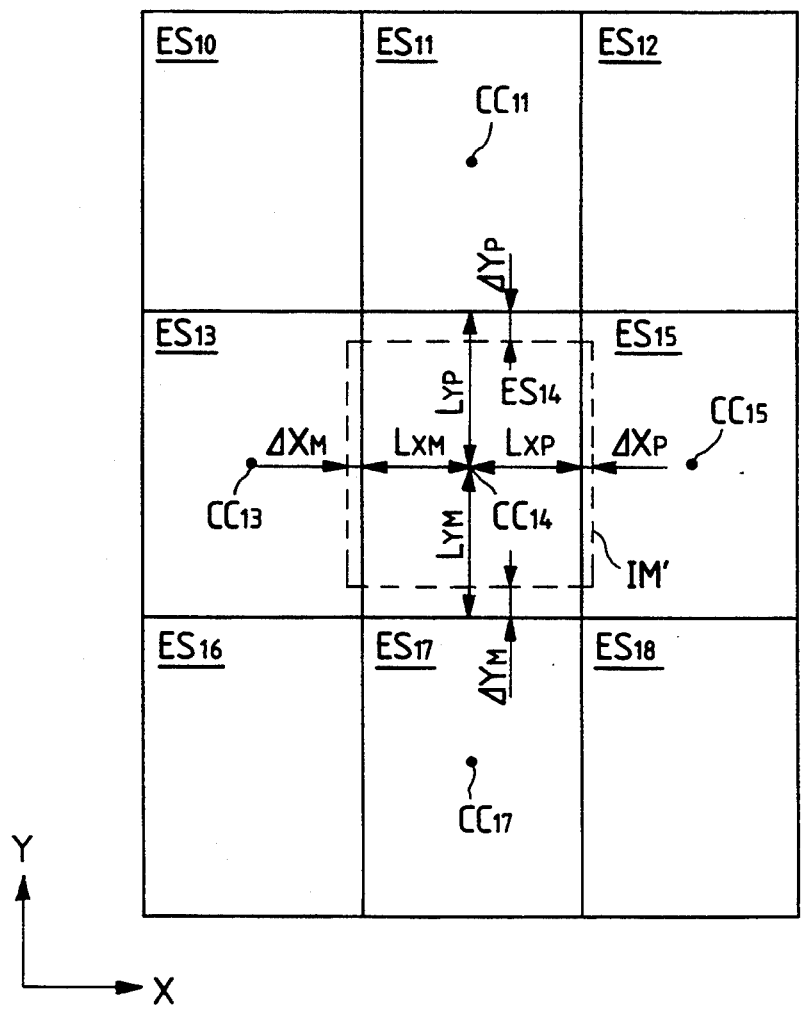
FIG. 5 shows how to calculate a magnification error in a shot area by the exposure method of the second embodiment of the present invention.

In parallel with the aforementioned rough adjustment of the projection magnification, the EGA calculation section 100 executes statistical calculation per shot area in the W-EGA process with the coordinates of the sample shots in the memory section 105 provided with weights, and determines the coordinates by using the calculation parameters a to f obtained from equation (3). The coordinates for each shot area and the calculation parameters a to f are memorized in the memory section 106. After this process, the sequence controller 104 uses the coordinates calculated in the W-EGA process and stored in the memory section 106 and finds the magnification error of the projection image IM' of FIG. 4B in the shot area on the wafer. The way how to find the magnification errors with reference to FIG. 5 will be described briefly. In FIG. 5 are shown nine shot areas $ES_{10}$ to $ES_{18}$ on a wafer, in which the center $CC_{14}$ coincides with the center of the projection image IM'. In this condition, the magnification error for the shot is obtained.

The coordinates of the shot area $ES_{14}$ and four shot areas $ES_{11}$, $ES_{13}$, $ES_{17}$ and $ES_{17}$ adjacent to the shot area $ES_{14}$ are read out to find the distances between the center $CC_{14}$ and the centers $CC_{11}$, $CC_{13}$, $CC_{15}$ and $CC_{17}$ of the four shot areas. Next, a process is performed to obtain the size of the shot area $ES_{14}$, i.e., the distances $L_{XP}$, $L_{XM}$, $L_{YP}$ and $L_{YM}$ between the center $CC_{14}$ and the four sides. For example, the distance $L_{XP}$ is selected as half as the distance between the center $CC_{14}$ and the center $CC_{15}$. This is deduced from the idea that the arrangement errors are substantially the same on the local area on a wafer to which the fundamental idea of the $W_1$-EGA process is applicable, i.e., which has a regular non-linear distortion. As a scribe line exists between the shot areas $ES_{14}$ and $ES_{15}$, though, the distance $L_{XP}$ is found actually by considering its width. For simplicity for the simplicity of explanation, it is assumed that the distance $L_{XP}$ is as half as the aforementioned central distance.

The differences $\Delta X_P$, $\Delta X_M$, $\Delta Y_P$ and $\Delta Y_M$ between the four distances $L_{XP}$, $L_{XM}$, $L_{YP}$ and $L_M$ and the previously found size (distance M) of the projection image IM' are obtained. As apparent from FIG. 5, the differences are the magnification errors of the projection image IM' in the shot area $ES_{14}$ themselves. Thus, it is possible to overlap the whole area of the projection image IM' to the shot area $ES_{14}$ accurately by adjusting the projection magnification of the projection optical system PL corresponding to the differences (magnification errors). In this embodiment, therefore, four magnification errors per shot area are obtained by using the coordinates calculated in the W-EGA process, and re-adjustment (fine adjustment) of the projection magnification of the projection optical system PL are carried out in accordance with these differences.

The number of shot areas adjacent to each of some shot areas at the peripheral portions of a wafer can be less than four. For example, the first shot area $ES_1$ on the wafer in FIG. 3 has only two adjacent shot areas $ES_2$ and $ES_7$. In this case, two imaginary shot areas $IS_2$ and $IS_4$ are previously set for the shot area $ES_1$. When the coordinates of all shot areas on the wafer are calculated in the W-EGA as described above, the coordinates of the imaginary shots $IS_2$ and $IS_4$ are also obtained. In this way, four magnification errors can also be obtained for the shot area $ES_1$. In other words, in this embodiment, imaginary shots equal to insufficient number of adjacent shot areas are set for each shot area surrounded by less than four adjacent shot areas, and the coordinates of all of the real shot areas and the imaginary shot areas are obtained in the W-EGA process.

After the aforementioned magnification errors of all shot areas on the wafer have been obtained, the wafer stage is set in position by the sequence controller 104 according to the coordinates of the shot areas supplied from the EGA calculation section 100, and the projection magnification of the projection optical system PL is adjusted by the pressure regulator 21 or the imaging optical characteristic adjuster 20 according to the magnification errors per shot area. As a result, the all area of the projection image of the reticle pattern can overlap with the all shot areas on the wafer W accurately. In this way, the overlapping accuracy between the shot areas and the projection image of the reticle pattern can be improved without lowering the throughput. Since the projection magnification is roughly adjusted in the EGA process prior to the magnification adjustment per shot area, the magnification per shot area can be adjusted accurately in a short time.

When the projection magnification is finely adjusted per shot area in this embodiment, the aforementioned magnification errors $\Delta X_P$, $\Delta_M$, $\Delta Y$ and $\Delta_M$ are used. Since, however, neither the imaging optical characteristic adjuster 20 nor the pressure regulator 21 can adjust the magnifications in the X and Y directions independently as mentioned before, the magnification adjustment is performed at the average of the four magnification errors, for example. Alternatively, four minimum projection magnifications may be obtained by using the statistic calculation such as the method of least squares, and the magnifications of the projection optical system PL may be adjusted to the obtained values. In another way, the average $$\Delta X_A = \frac{\Delta X_P + \Delta X_M}{2}$$

of the magnification errors $\Delta X_p$ and $\Delta X_M$ and the average $$\Delta Y_A = \frac{\Delta Y_P + \Delta Y_M}{2}$$

of the magnification errors $\Delta Y_P$ and $\Delta Y_M$ may be multiplied by the weight coefficients $\omega_1$, $\omega_2$ corresponding to the pattern line widths, pitches and the like, the weighed magnification errors may be averaged in accordance with the formula $$\frac{\omega_1 \Delta X_A + \omega_2 \Delta Y_A}{\omega_1 + \omega_2}.$$

The projection magnification may be adjusted in accordance with the average $$\frac{\omega_1 \Delta X_A + \omega_2 \Delta Y_A}{\omega_1 + \omega_2}.$$

In this embodiment, the projection magnification is finely adjusted per shot area. However, each shot area on a wafer may be divided into a plurality of blocks, and the magnification may be adjusted per block by using the average of the magnification errors of the all shot areas in the same block or the average of the maximum value and the minimum value of the magnification errors.

The differences (arrangement errors) between the coordinates (calculated values) obtained in the W-EGA process and the designed values of the coordinates may be found in the EGA calculation section 100, and the projection magnifications of only the shot areas in which the arrangement errors exceed the predetermined values may be finely adjusted. It is unnecessary to find the magnification errors of the shot areas in which fine adjustment is not made. Furthermore, fine adjustment may not be performed in the shot areas in which the magnification errors are zero or less than the predetermined tolerances.

In this embodiment, four magnification errors $\Delta X_P$, $\Delta X_M$, $\Delta Y_P$ and $\Delta Y_M$ are obtained per shot area. However, for example, at least one of the four magnification errors may be found and the magnification adjustment may be made merely by the thus obtained magnification error. Therefore, no imaginary shots may be set for a shot area as long as it has at least one adjacent shot area.

In this embodiment, the projection magnification is roughly adjusted in the EGA process. However, for example, rough adjustment of the projection magnification may be made by using at least one of the calculation parameters a and d of each of all shot areas obtained in the W-EGA process or the average of the calculation parameters of a plurality of shot areas. In another way, the projection magnification may not be roughly adjusted but only finely adjusted in accordance with the aforementioned magnification errors.

The overlapping exposure for the shot area $ES_1$ can be immediately performed at the time when the coordinates of the i-th shot area $ES_1$ on the wafer and its magnification errors are calculated. The coordinates of the second shot area and the following shot areas and their magnification errors are obtained by means of the EGA calculation section 100 and the sequence controller 104 in parallel with a series of the exposure processes.

Figure 6A:
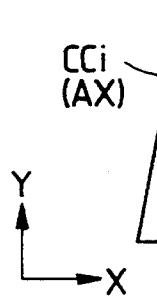
FIGS. 6A and 6B illustrate how to adjust magnification by the exposure method of the third embodiment of the present invention.

The exposure sequence according to the third embodiment of the present invention will be described. In this embodiment, the $W_1$-EGA process is also adopted to the treatment of a wafer having non-linear distortion. It is assumed that the shot area ESi has not only a magnification error but also a distortion error as shown in FIG. 6A in which the magnification error and the distortion error between the i-th shot area ESi and the projection image IM of the reticle pattern IM are exaggeratedly shown.

In the projection exposure apparatus as shown in FIGS. 1 and 2, the sequence controller 104 executes sample alignment by using two sets of LSA systems in accordance with the sample shot arrangement supplied from the designating section 103. The signal processing section receives a photoelectric signal from the LSA system 17, finds the coordinates of each mark and outputs them to the memory section 105. Thereafter, the EGA calculation section 100 operates in the aforementioned EGA process so that the calculation parameters a to f are obtained from equation (2) by using the coordinates of at least three sample shots stored in the memory section 105.

Figure 6B:
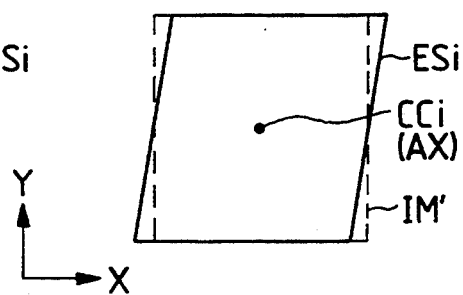

The sequence controller 104 adjusts the projection magnification of the projection magnification of the projection optical system PL through the pressure adjuster 21 or the imaging optical characteristic adjuster 20. For the simplicity of the explanation, it is assumed in this embodiment that the magnification errors between the shot areas on the wafer and the projection image is diminished only by the magnification adjustment. According to this adjustment, the state of the projection image IM of the reticle pattern in the i-th shot area ESi on the wafer changes from the state in FIG. 6A to the state in FIG. 6B. The sequence controller 104 finds, from the projection magnification before adjustment (corresponding to the aforementioned predetermined value) and its adjustment rates (the parameters a and d), the size of the projection image IM' adjusted in magnification as shown in FIG. 6B, i.e., the distance $M_R$ between the center AX of the projection image IM' and a corner thereof and memorizes the size.

Figure 7:
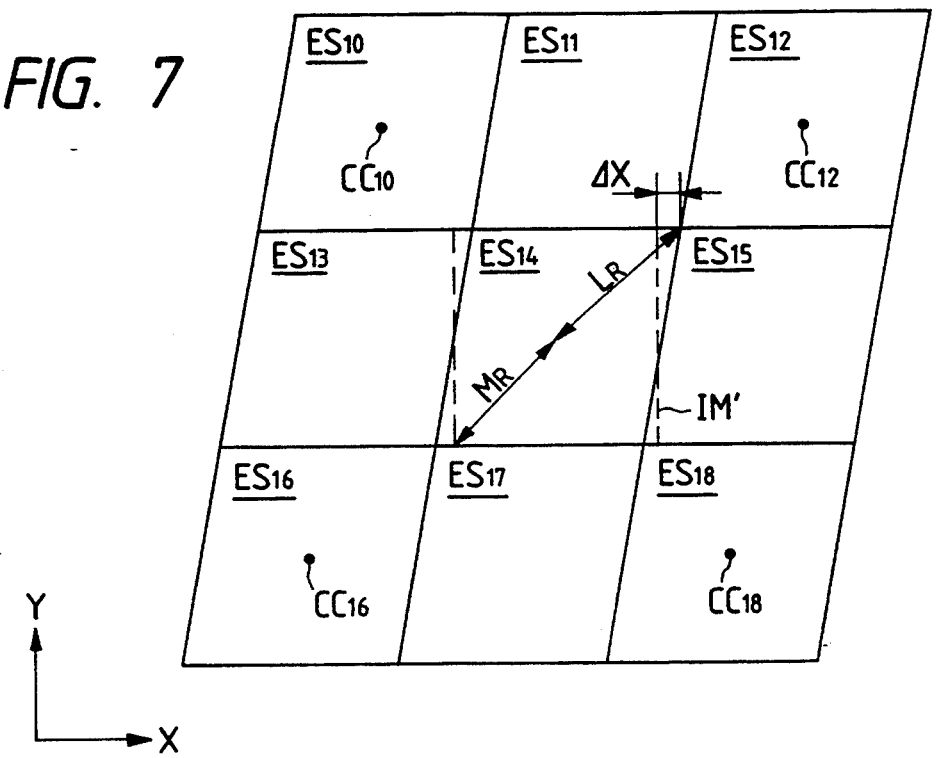
FIG. 7 shows how to calculate a distortion error of a shot area by the exposure method of the third embodiment.

On the other hand, the EGA calculation section 100 gives weights, from the weight generation section 101, to the coordinates of the sample shorts in the memory section 105 per shot area in the W-EGA process in parallel with the aforementioned magnification adjustment, executes the statistical calculation and determines the coordinates by using the calculation parameters a to f obtained from equation (3). The coordinates per shot area and the calculation parameters a to f are memorized in the memory section 106. Thereafter, the sequence controller 104 finds the distortion errors of the projection image IM' (FIG. 6B left in the shot area after the aforementioned magnification adjustment by using the coordinates calculated in the W-EGA process and stored in the memory section 106. The distortion error finding in this embodiment is the same as the multiplication error finding in the second embodiment and will be described briefly with reference to FIG. 7 in which the deformation of each of the nine shot areas $ES_{10}$ to $ES_{16}$ into a rhomboid is exaggerated shown.

In order to obtain the distortion error of the projection image IM' in the shot area $ES_{14}$, the distance $L_R$ between the center $CC_{14}$ of the shot area $ES_{14}$ and a corner thereof is obtained from the distance between the center $CC_{14}$ of the shot area $ES_{14}$ and the center of the shot area $ES_{12}$. In the same manner as in the second embodiment, the distance $L_R$ is half the distance between the centers of the shot areas $ES_{14}$ and $ES_{12}$. The difference $\Delta X$ between the distance $L_R$ and the distance $M_R$ of the projection image IM' is found as a distortion error. As a result, the whole area of the projection image IM' can overlap with the shot area $ES_{14}$ accurately by adjusting the distortion of the projection optical system PL due to the distortion error $\Delta X$.

In this description, the distortion error is found by using only the shot area $ES_{12}$. In place of it, the distortion errors of three shot areas $ES_{10}$, $ES_{16}$ and $ES_{18}$ are obtained, and the distortion is adjusted based on the average of them. In other words, the distortion error used for adjusting the distortion may be obtained from at least one of the four distortion errors like the aforementioned magnification error, the average of them or the result of statistical calculation of them.

After having found the distortion errors in all shot areas on the wafer, the sequence controller 104 sets the wafer stage WS in position in accordance with the coordinates of the shot areas from the EGA calculation section 100 and adjusts the distortion of the projection optical system PL through the imaging optical characteristic adjuster 20. This enables the whole area of the projection image of the reticle pattern to overlap with all shot areas accurately. Thus, the overlapping accuracy between the projection image of the reticle pattern and the shot areas can be improved without lowering the throughput.

In this embodiment, the description is made in case where the shot areas are deformed into a rhomboid. However, the method of this embodiment is effectively applicable to shot areas which are deformed not only isotropically but also anisotropically (for example, into a rhomboid or into a trapezoid). In this embodiment, the EGa process is used to correct the magnification errors. In this embodiment, however, any magnification adjusting methods used in the first and second embodiments may be adopted. The aforementioned distortion errors may be compensated in every shot area, in every block or merely in the shot areas in which the arrangement errors exceed the predetermined value. In another way, the magnification adjustment may not be made but only the distortion adjustment may be carried out corresponding to the aforementioned distortion errors. In a further way, the overlapping exposure on the shot area $ES_1$ can be immediately done at the time when the coordinates and the distortion errors of the first shot area $ES_1$ are calculated.

For the simplicity of the description of this embodiment, it is assumed that the magnifications of the shot areas and the projection image errors can become approximately zero if the magnifications have been adjusted once before the exposure. However, both magnification adjusting method used in the first embodiment and the distortion correcting method used in this embodiment may be employed. The magnification may be adjusted per shot area so as to accord with the calculation parameters a and d calculated in the W-EGA process and the distortion may be adjusted corresponding to the distortion errors calculated in this embodiment. In addition to the latter method, the projection magnification may be roughly adjusted by using the calculation parameters a and f in the EGA process or in the W-EGA process.

In the second and third embodiments, the magnification error and the distortion error in a shot area is found by using the coordinates of the adjacent shots calculated in the W-EGA process. Alternatively, a plurality of imaginary points of each shot area other than its shot center whose coordinates are calculated in the W-EGA process (for example, eight points consisting of the four corners and the centers of the four sides of the shot area) are set in each shot area. When the coordinates of the center are obtained in the W-EGA process, the coordinates of the eight imaginary points and the shot center are calculated, and the magnification errors and/or the distortion errors of the shot areas are obtained based on the coordinates of the center and the coordinates of the imaginary points. In this case, the coordinates of the nine points may be mathematically treated by the primary approximation method by applying the statistical calculation (the method of least squares) to calculate the sizes and shapes of the shot areas and the differences between the calculated values, as one party, and the projection magnification, and the distortion of the optical system PL, as the other party, may be obtained. The adjustments of the projection magnification and/or the distortions corresponding to the magnification errors found per shot area and/or the distortion errors allow, the whole area of the projection image of the reticle pattern to overlap with the shot areas.

Figure 3:
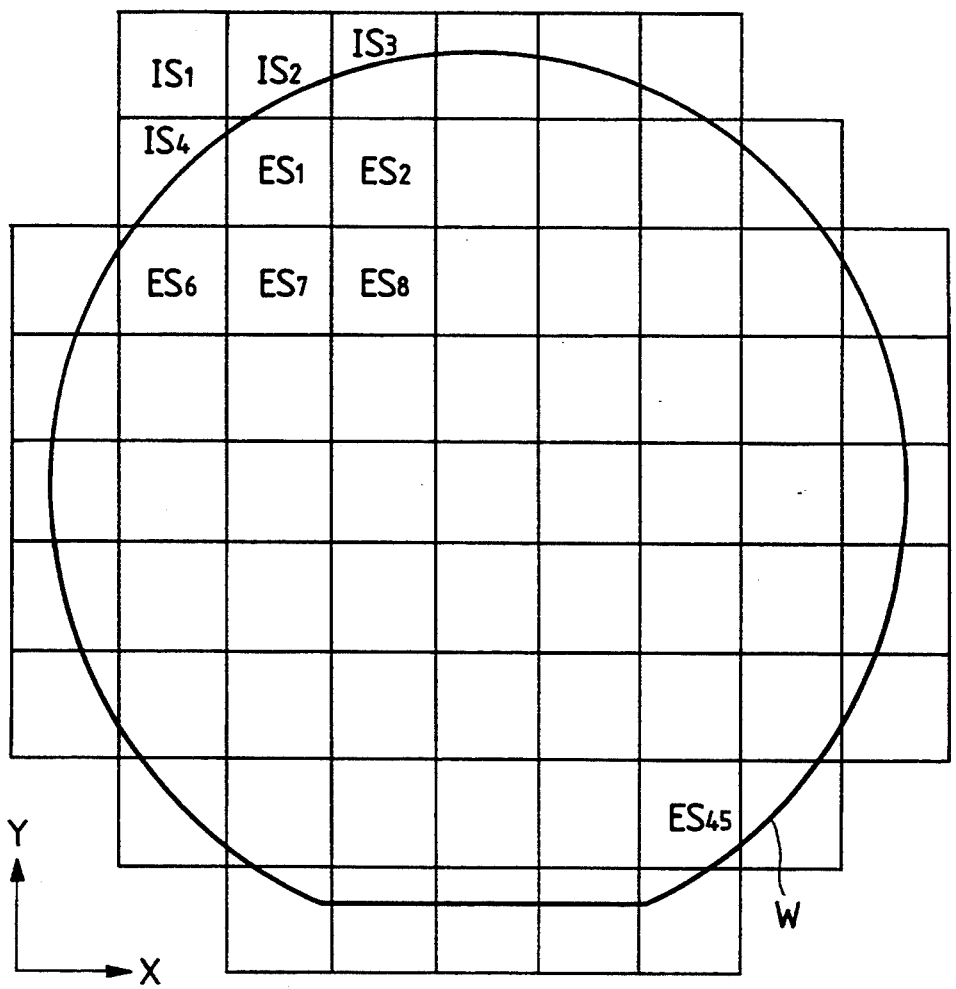
FIG. 3 shows arrangement of shot areas on a wafer.

In the description with reference to FIGS. 1 to 3, the wafer treated in the W-EGA process has non-linear distortions. To a wafer which has sufficiently small distortions and substantive linear distortions can be applied the EGA process so that the magnification errors between the shot areas and the projection image of the reticle pattern are corrected. This method will be described briefly.

In the projection exposure apparatus as shown in FIGS. 1 and 2, the sequence controller 104 executes sample alignment by using two sets of LSA systems according to the sample shot arrangement determined by the designating unit 103. The designating unit 103 determines the number and the positions of the sample shots so that they form a polygon at the peripheries of the wafer. The signal processing section 16 receives a photoelectric signal from the LSA system 17, finds the coordinates of the marks and outputs the coordinates to the memory section 105. The EGA calculation section 100 determines the coordinates of the sample shots in the memory section 105. In other words, the EGA calculation section 100 executes the statistical calculation (the method of least squares) by using the coordinates of the sample shots in the memory section 105, calculates the calculation parameters a to f from equation (2), and determines the coordinates of all shot areas by using the parameters a to f. After adjusting the projection magnification of the projection optical system PL through the imaging optical characteristic adjuster 20 or the pressure regulator 21 in correspondence with the parameters a and d expressing scaling, the sequence controller 104 sets the wafer stage WS in position in turn according to the coordinates supplied from the EGA calculation section 100 and executes the overlapping exposure. In consequence, the whole area of the projection image of the reticle pattern can overlap with all shot areas on the wafer.

The optimum overlapping exposure can be selected from the overlapping exposures used in the first to third embodiments depending upon whether the distortion of wafers to be exposed is linear or non-linear. Thus, improvement of the overlapping accuracy and the throughput can be expected. In this case, the exposure method can be selected by the operator or automatically by the sequence controller 104 due to the characteristics of the arrangement errors.

In all the embodiments, the $W_1$-EGA process is used. However, the $W_2$-EGA process can be employed in place of the $W_1$-EGA process without altering the aforementioned sequence. When this invention is applied to an projection exposure apparatus of a scanning type such as a projection exposure apparatus of a step and scan type (S and S type), the magnification errors of the shot area and the distortion errors of the shot area are obtained in the same way as mentioned above but the method of adjusting the magnification and the distortion of the projection optical system at the time of the overlapping exposure is different from the aforementioned total exposure method. In the S & S method, the magnification in the scanning direction can be adjusted by providing a speed difference between the reticle and the wafer and the magnification in the non-scanning direction can be adjusted by the imaging optical characteristic adjuster 21 or the pressure regulator 22. Furthermore, the distortion are adjusted in synchronism with the relative scanning by using the imaging optical characteristic adjustment.

What is claimed is:

1. An exposure method of aligning a plurality of shot areas arranged on a substrate with a predetermined exposure position and transcribing, on said substrate, a pattern formed on a mask through a projection optical system, said exposure method comprising the steps of:
   (a) measuring coordinates of a plurality of sample shot areas selected from a plurality of shot areas;
   (b) determining weight coefficients corresponding to said coordinates of said sample shot areas;
   (c) performing statistical calculation based on said coordinates and said weight coefficients of said sample shot areas which were measured and determining coordinates of a predetermined shot area;
   (d) controlling the movement of the substrate according to said determined coordinated of said predetermined shot area; and
   (e) adjusting an imaging characteristic of said projection optical system based on a parameter expressing deformation of said shot areas selected from a plurality of parameters obtained by said statistical calculation.

2. The method according to claim 1, wherein said parameter expressing said deformation of said shot areas corresponds to said predetermined shot area and said adjusting step (e) is executed upon exposing each shot area.

3. The method according to claim 2, wherein said parameter expressing said deformation of said shot areas is an average value of parameters expressing said deformation of said shot areas.

4. The method according to claim 1, wherein said imaging characteristic of said projection optical system includes at least one of the projection magnification of the image of said pattern and distortion of the image of said pattern.

5. The method according to claim 1, wherein said parameter expressing said deformation is an average of deformations of some of said shot areas.

6. The method according to claim 1, wherein said adjusting of said imaging optical characteristic of said projection optical system is executed before said predetermined shot area is set in position.

7. The method according to claim 1, further comprising the step of:
   roughly adjusting the imaging characteristic of said projection optical system based on said parameter expressing deformation of said shot areas among said parameters calculated by statistical calculation without considering said weight coefficients; and then
   executing said adjusting as defined in said adjusting step (e).

8. The method according to claim 1, further comprising the steps of:
   calculating distortion of said predetermined shot area based on coordinates of at least two shot areas adjacent to said predetermined shot area whose distortion should be calculated; and
   adjusting distortion of the image of said pattern corresponding to the thus calculated distortion of said predetermined shot area.

9. The method according to claim 1, wherein said weight coefficients are determined by distances between said predetermined shot area and said sample shot areas.

10. The method according to claim 1, wherein said weight coefficients are determined by distances between said predetermined shot area and a center of said substrate.

11. The method according to claim 1, wherein said sample shot areas are at least three in number.

12. The method according to claim 1, wherein said plurality of parameters are determined to minimize a square sum of the residuals between coordinates obtained by using a linear model based on the designed coordinates of said sample shot areas and measured coordinates of said sample shot areas.

13. The method according to claim 1, wherein it is decided whether or not said step (e) of adjusting an imaging optical characteristic is carried out, by comparing the coordinates of shot areas determined based on a plurality of parameters obtained by said statistical calculation and the designed values of the coordinates of those shot areas.

14. The method according to claim 1, wherein said parameter expressing said deformation is based on an average of deformations of some of said shot areas in one of a plurality of blocks into which said shot areas are divided, and
   said adjusting step (e) is executed based on said parameter upon exposing each shot area in said one block.

15. The method according to claim 1, wherein said adjusting step (e) is executed while moving said substrate.

16. The method according to claim 1, further comprising the step of:
   after said adjusting step (e), finely adjusting the imaging characteristic based on determined coordinates of some of said shot areas.

17. The method according to claim 1, further comprising the step of:
   adjusting another imaging characteristic of said projection optical system based on determined coordinates of some of said shot areas.

18. A method of aligning a plurality of shot areas arranged on a substrate with a predetermined exposure position and transcribing, on the substrate, a pattern formed on a mask through a projection optical system, said exposure method comprising the steps of:
   (a) measuring coordinates of a plurality of sample shot areas selected from a plurality of shot areas;
   (b) determining coordinates of the shot areas by performing statistical calculation due to the measured coordinates of said sample shot areas; and
   (c) adjusting an imaging characteristic of said projection optical system based on at least one parameter among a plurality of parameters obtained by said statistical calculation upon determining said coordinates of said plurality of shot areas.

19. The method according to claim 18, wherein
   said plurality of parameters are determined to minimize a square sum of the residuals between coordinates obtained by using a linear model based on the designed coordinates of said sample shot areas and measured coordinates of said sample shot areas; and
   said at least one parameter includes a scaling parameter.

20. An exposure method of aligning a plurality of shot areas arranged on a substrate with a predetermined exposure position and forming the image of a pattern of a mask on said substrate through a projection optical system, said exposure method comprising the steps of:
   (a) measuring coordinates of a plurality of sample shot areas selected from a plurality of shot areas; and
   (b) adjusting at least one of projection magnification of the image of said pattern and distortion of the image of said pattern based on at least one of a plurality of parameters of a model for deciding coordinates of said plurality of shot areas.

21. The method according to claim 20, wherein said model is a linear model and said at least one parameter includes a scaling parameter expressing distortion.

22. A micro-device manufacturing method of aligning a plurality of shot areas arranged on a substrate with a predetermined exposure position forming the image of a pattern of a mask on said substrate through a projection optical system, said micro-device manufacturing method comprising the steps of:
   (a) measuring coordinates of a plurality of sample shot areas selected from a plurality of shot areas; and
   (b) adjusting at least one of projection magnification of the image of said pattern and distortion of the image of said pattern based on at least one of a plurality of parameters of a model for deciding coordinates of said plurality of shot areas.

23. An exposure apparatus for aligning a plurality of shot areas arranged on a substrate with a predetermined exposure position and forming the image of a pattern of a mask on said substrate through a projection optical system, said exposure apparatus comprising:
   (a) a measuring device for measuring coordinates of a plurality of sample shot areas selected from a plurality of shot areas;
   (b) a control system which determines weight coefficients of said sample shot areas, performs statistical calculation based on said coordinates and said weight coefficients of said sample shot areas and determines coordinates of said shot areas:
   (c) a controller for moving said substrate according to the coordinates of said shot areas which determined by said control system; and
   (d) an adjusting device for adjusting an imaging characteristic of said projection optical system based on a parameter expressing deformation of said shot areas selected from a plurality of parameters obtained by said statistical calculation.

24. An exposure apparatus for aligning a plurality of shot areas arranged on a substrate with a predetermined exposure position and forming the image of a pattern of a mask on said substrate through a projection optical system, said exposure apparatus comprising:
   (a) a measuring device for measuring coordinates of a plurality of sample shot areas selected from a plurality of shot areas:
   (b) a control system which performs calculation based on the measured coordinates, designed coordinates of said sample shot areas and a model for deciding coordinates of said plurality of shot areas, and determines coordinates of said shot areas; and
   (c) an adjusting device for adjusting at least one of projection magnification of the image of said pattern and distortion of the image of said pattern based on at least one of a plurality of parameters obtained by said calculation, wherein
   said model is a linear model,
   said plurality of parameters are determined to minimize a square sum of the residuals between coordinates obtained by using said model based on the designed coordinates of said sample shot areas and measured coordinates of said sample shot areas, and
   said at least one parameter includes a scaling parameter.

25. An exposure method of aligning a plurality of shot areas arranged on a substrate with a predetermined exposure position and transcribing, on said substrate, a pattern formed on a mask through a projection optical system, said exposure method comprising the steps of:
   (a) measuring coordinates of a plurality of sample shot areas selected from a plurality of shot areas;
   (b) performing calculation based on the measured coordinates and designed coordinates of said sample shot areas and a model for deciding coordinates of said plurality of shot areas, and determining coordinates of said shot areas; and
   (c) adjusting at least one of projection magnification of the image of said pattern and distortion of the image of said pattern based on at least one of a plurality of parameters obtained by said calculation.

* * * * *